United States Patent [19]
Wittig et al.

[11] Patent Number: 6,118,300
[45] Date of Patent: Sep. 12, 2000

[54] METHOD FOR IMPLEMENTING LARGE MULTIPLEXERS WITH FPGA LOOKUP TABLES

[75] Inventors: Ralph D. Wittig, Menlo Park; Sundararajarao Mohan, Cupertino, both of Calif.

[73] Assignee: XILINX, Inc., San Jose, Calif.

[21] Appl. No.: 09/199,037

[22] Filed: Nov. 24, 1998

[51] Int. Cl.[7] .................. H01L 25/00; H03K 19/177; H03K 19/173

[52] U.S. Cl. .................. 326/41; 326/47

[58] Field of Search .................. 326/41, 39, 40, 326/47, 101, 46

[56] References Cited

U.S. PATENT DOCUMENTS

| | | | |
|---|---|---|---|
| 4,870,302 | 9/1989 | Freeman | 307/465 |
| 5,386,156 | 1/1995 | Britton et al. | 326/37 |
| 5,724,276 | 3/1998 | Rose et al. | 364/716.06 |
| 5,815,726 | 9/1998 | Cliff | 395/800.01 |
| 5,898,602 | 4/1999 | Rothman et al. | 364/716.01 |
| 5,914,616 | 6/1999 | Young et al. | 326/41 |
| 5,999,015 | 12/1999 | Cliff et al. | 326/39 |
| 6,043,676 | 3/2000 | Mendel et al. | 326/39 |

OTHER PUBLICATIONS

"The Programmable Logic Data Book", published 1998, available from Xilinx, Inc., 2100 Logic Drive, San Jose, California 95124.

"Altera Data Book", published Mar., 1995, available from Altera Corporation, 2610 Orchard Parkway, San Jose, CA 95134–2020, pp. 42–46.

*Primary Examiner*—Michael Tokar
*Assistant Examiner*—Daniel D. Chang
*Attorney, Agent, or Firm*—Edel M. Young; LeRoy D. Maunu

[57] ABSTRACT

A method for implementing a large multiplexer with FPGA lookup tables. Logic that defines a multiplexer is detected and implemented according to the number of inputs and the target FPGA architecture. In one situation, a large multiplexer is implemented in two stages. The first stage implements wide AND functions of each of the input signals using lookup tables and carry logic. In a second stage, the resulting decoded input signals are combined in a wide OR gate again formed from lookup tables and a carry chain. In another situation, the multiplexer is implemented as a tree structure using lookup tables that implement 2:1 multiplexers in combination with other 2:1 multiplexers provided by configurable logic blocks of the FPGA.

15 Claims, 16 Drawing Sheets

METHOD FOR IMPLEMENTING LARGE MULTIPLEXERS WITH FPGA LOOKUP TABLES

RELATED PATENT APPLICATIONS

This patent application is related to the following patent application:

U.S. patent application Ser. No. 09/193,283 entitled "METHOD FOR IMPLEMENTING WIDE GATES AND TRISTATE BUSES USING FPGA CARRY LOGIC," by Wittig, Mohan, and Fallside filed on Nov. 17, 1998, which is assigned to the assignee of the present invention, and the contents of which are incorporated herein by reference.

FIELD OF THE INVENTION

The present invention generally relates to implementing multiplexers in field programmable gate arrays (FPGAs), and more particularly to implementing large multiplexers using FPGA lookup tables.

BACKGROUND

Programmable integrated circuits (ICs) are a well-known type of integrated circuit that may be programmed by a user to perform specified logic functions. (The term "programmable ICs" as used herein includes but is not limited to FPGAs, mask programmable devices such as Application Specific ICs (ASICs), Programmable Logic Devices (PLDs), and devices in which only a portion of the logic is programmable.) One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration data may be read from memory (e.g., an external PROM) or written into the FPGA by an external device. The collective states of the individual memory cells then determine the function of the FPGA.

A CLB typically includes one or more function generators (often implemented as lookup tables, or LUTs), and one or more registers that can optionally be used to register the LUT outputs. Some CLBs also include chains of carry logic that is used to implement arithmetic functions such as adders, subtractors, counters, and multipliers. Implementing logic using these carry chains can be faster, sometimes much faster, than implementing the equivalent logic in LUTs and passing carry signals from one bit to the next through the interconnect structure. The speed of a carry chain depends on the number of bits in the carry chain and the speed of each carry bit (among other factors). The speed of the equivalent logic implemented as LUTs depends on the number of levels of logic (i.e., the number of LUTs on the slowest path) required to implement the function. Usually, using the carry chain is faster. However, using the carry chain imposes placement constraints because the ordering of portions of the user's function is set by the carry chain.

Two forms of design entry are common: schematic entry and Hardware Description Languages (HDLs) such as Verilog and VHDL. When schematic entry is used, the designer specifies the exact implementation desired for his circuit. At a higher level, when HDL code is used, the circuit is described by its logical function. Synthesis software then translates the logical function into specific logic targeted for a specified FPGA. Although circuit elements can be manually instantiated in HDL code, this method is avoided since it is labor-intensive and the code can typically only be targeted to a specific programmable IC architecture.

Well-known synthesis tools such as those distributed by Synopsys, Inc., of Mountain View, Calif., recognize arithmetic functions in the HDL code and implement these functions using carry logic. Other functions such as wide logic gates and cascade circuits can also be implemented using carry logic. However, these other types of functions used in HDL code are not so implemented by the synthesis tools, even when the method that is used results in a much slower circuit. It would be desirable, therefore, for synthesis tools to implement logic in a manner that makes better use of the carry structure in order to minimize the delay of the circuit. Further, when implementing multiplexers, the synthesis tools may instantiate all $2^n$ multiplexer inputs where n is the number of select inputs for the multiplexer, even when only a few of the $2^n$ multiplexer input signals will be used. For example, HDL code often includes segments such as the following:

```
wire busSigA[0:11];
    select on (busSigA) {
        case '010 ... 10':
            out <= in6;
        case '01100 ... 0':
            out <= in10;
        case '1000 ... 10':
            out <= in25;
        case others:
            out <= 1'b0;
    }
```

The above code segment specifies that there are 12 select signals (0 through 11) and that for three combinations of these select signals, input signals in6, in10, and in25 are to be provided as output signals, otherwise logic 0 is to be provided as an output signal.

The well-known synthesis tools automatically translate the above code segment into a large multiplexer with 12 select inputs (busSigA) and 212=4096 data inputs. However, 4093 of these data inputs are logic 0.

Conventional FPGA software has simplified the above HDL construct with the following steps:

(1) Convert the 4096-input multiplexer into an AND-OR form where an AND gate decodes the select signals plus one input signal, and the AND gate outputs are applied to an OR gate.

(2) Optimize the AND-OR form, resulting in a much smaller logic network.

(3) Implement the resulting logic network in LUTs of the FPGA.

While the above simplification greatly improves efficiency of the resulting multiplexer implementation, it would be preferable to take advantage of all architectural features available in an FPGA in order to produce the smallest and fastest implementation that can be implemented in the FPGA. It would also be preferable that such an improvement be applicable to non-programmable replacement structures for FPGAs and to other IC devices having the necessary architectural features.

SUMMARY OF THE INVENTION

According to various embodiments, the present invention provides a method for implementing a wide multiplexer in a programmable integrated circuit. In a first embodiment, the method comprises detecting logic that defines a multiplexer, the logic including a plurality of selection signals and a plurality of input signals, wherein a selected combination of logic states of the selection signals selects a particular input signal. If the multiplexer has more than a threshold number of input signals, the multiplexer is implemented using pluralities of lookup tables and carry multiplexers, the pluralities of lookup tables and carry multiplexers grouped into sets of two or more lookup tables and two or more associated carry multiplexers, wherein each set implements a respective one of the combinations of logic states and is configured to receive as input the plurality of selection signals and a respective one of the input signals, each lookup table having an output terminal coupled to a select terminal of a respective one of the carry multiplexers, each carry multiplexer having an output terminal and first and second input terminals. The carry multiplexers receive a first selected logic level on first input terminals. A first one of the carry multiplexers has a second input terminal configured to receive a second selected logic level signal, a last one of the carry multiplexers has an output terminal configured to provide an output signal for the multiplexer, and the second input terminal of each carry multiplexer is coupled to the output terminal of another one of the remaining carry multiplexers. Each of the sets of lookup tables is configured to implement an AND function if the first logic level (the default) is logic zero and to implement a NOR function if the first logic level (the default) is logic one.

In another embodiment, the method for implementing a multiplexer comprises detecting logic that defines a multiplexer and simulates multiplexers implemented by two methods, decode and tree, then compares the two multiplexer structures to determine which is faster (or smaller). The decode multiplexer is implemented as discussed above. The tree multiplexer is implemented using a plurality of lookup tables, a first set of 2:1 multiplexers, and a second set of 2:1 multiplexers, each lookup table implementing a 2:1 multiplexer, and a first set of the lookup tables configured to receive as input 2 respective ones of the input signals and a first selected one of the selection signals as a selector input, the lookup tables having respective outputs, and pairs of the lookup tables having outputs coupled to inputs of respective ones of the first set of 2:1 multiplexers. A second one of the selection signals is provided as a selection input to the first set of 2:1 multiplexers, pairs of the first set of 2:1 multiplexers having outputs coupled to inputs of the second set of 2:1 multiplexers. A third one of the selection signals is provided as a selection input to the second set of 2:1 multiplexers. The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the following figures, in which like reference numerals refer to similar elements.

Figure 1:
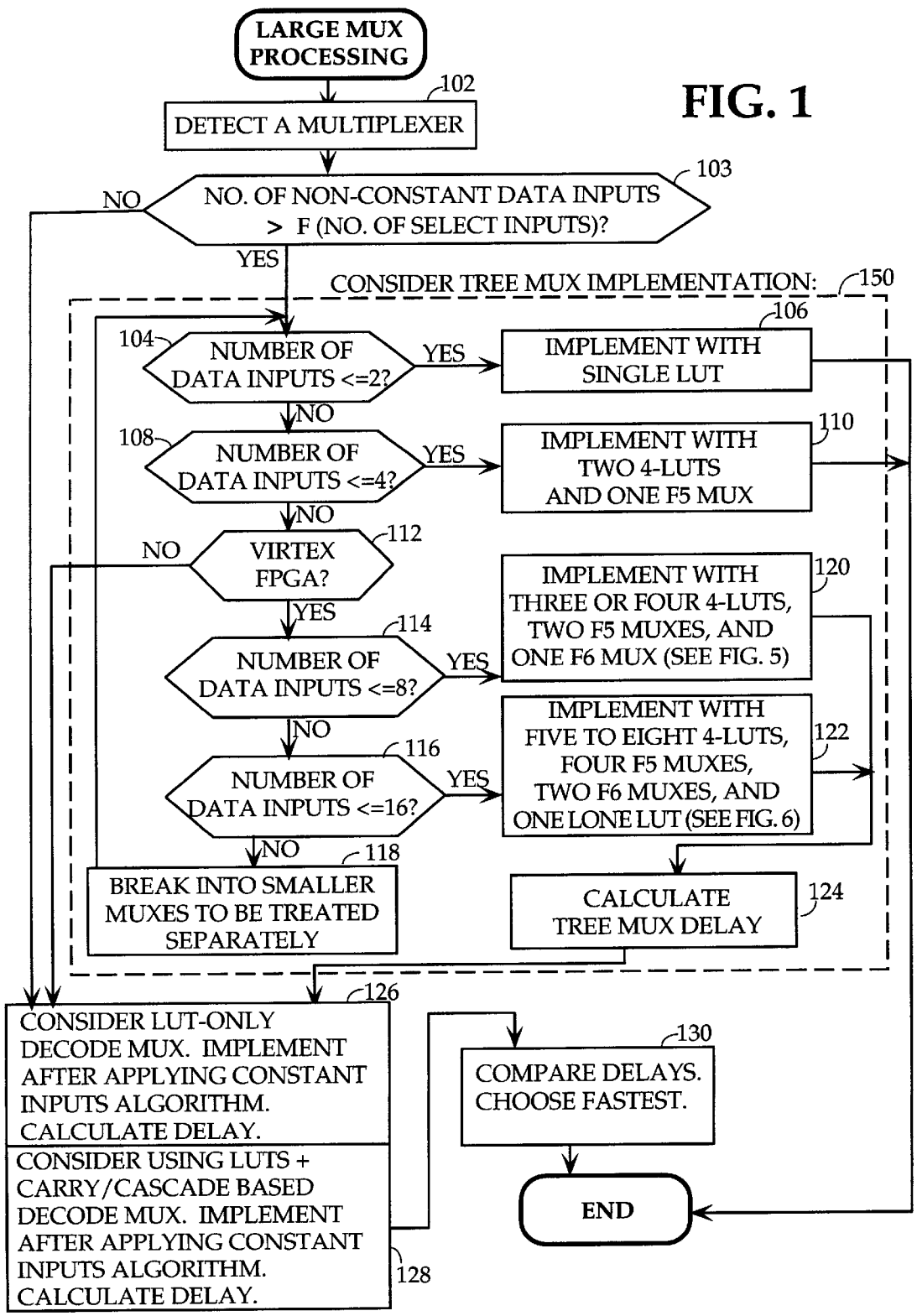
FIG. 1 is a flowchart of an example process for implementing a large multiplexer with selected elements of a field programmable gate array (FPGA).

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

Several examples of FPGA implementations of large multiplexers are described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

The example embodiments described herein reference various architectural features of the XC5200™ and Virtex™ FPGAs from Xilinx, Inc., assignee of the present invention. The XC5200 FPGA is described in the Xilinx Data Book (1998), which is incorporated herein by reference. Relevant portions of the Virtex architecture are described by Young et. al in U.S. patent application Ser. No. 08/806,997 filed Feb. 26, 1997 [docket X-277]. This application is also incorporated herein by reference. It will be appreciated that the invention, while having embodiments described which are directed to features of the XC5200 and Virtex FPGAs, has various aspects that may be applied to other FPGAs having similar architectural features. In particular, the invention may be applied to architectures having cascade features including a cascade chain interconnecting lookup table outputs.

Multiplexers are generally defined in terms of input signals and select signals, wherein logic states of the select signals dictate which of the input signals is selected and output by the multiplexer. It is recognized that n select signals can select one of $2^n$ input signals. The various hardware description language statements that set forth multiplexer definitions are well recognized and will not be repeated herein. Conventional synthesis software is presently capable of recognizing such multiplexer definitions.

FIG. 1 is a flowchart of an example process for implementing a large multiplexer with selected elements of a field programmable gate array (FPGA). In accordance with the invention, multiplexers having more than a selected number of inputs are given special consideration for implementation using special features of an FPGA. The goal of implementing the multiplexer with the special features is to improve the efficiency of the multiplexer by reducing the associated delay.

At step 102, a multiplexer is detected. Step 103 compares the number of non-constant data inputs to the number of select inputs. If the number of non-constant data inputs is far less than n where $2^n$ is the number of select inputs, then those multiplexer implementations that work best with few data inputs are considered. Only if the number of non-constant data inputs is closer to the maximum is a tree structure considered at steps 150. If the tree structure is to be considered, step 104 tests the number of input signals to be applied to the multiplexer. If the number of input signals is less than or equal to 2, step 106 conventionally implements the multiplexer with a single lookup table and the implementation processing is complete.

If the number of input signals to be applied to the multiplexer is less than or equal to 4, step 108 directs control to step 110 where the multiplexer is implemented with 2 4-input LUTs and one F5 multiplexer. The F5 multiplexer is a 2:1 multiplexer available in both the XC5200 and Virtex FPGAs for selecting between outputs of two four-input functions. The LUTs of this implementation are each configured to receive as inputs two of the input signals, and one of the select signals. The LUTs are configured to implement 2:1 multiplexers wherein one of the input signals is selected by the select signal. The outputs from the two LUTs are provided as inputs to the F5 multiplexer, which receives the second select signal as its select input. When step 110 has been performed, the process is complete.

Special features of the XC5200 and Virtex FPGAs are targeted if the number of inputs is greater than a selected number, for example 4. While the various example embodiments described in connection with the XC5200 and Virtex FPGAs have 4-input LUTs and multiplexers in their carry chains, it will be appreciated that the concepts of the invention as applied to 4-input LUTs could be extended to embodiments having LUTs with fewer or greater than 4 inputs, for example, 3, 8 or 16 inputs and to cascade architectures such as the FLEX architecture available from Altera Corp. having cascade chains in which an AND gate combines a LUT output into the cascade chain.

Figure 2A:
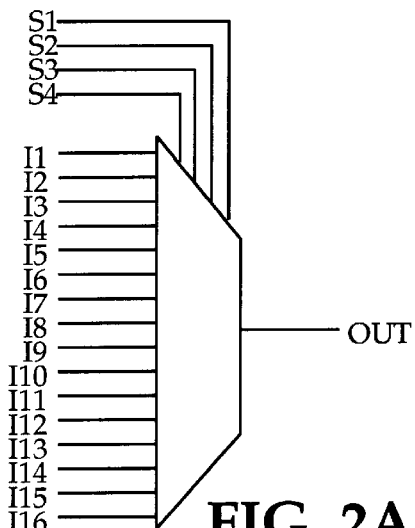
FIGS. 2A, 2B, and 2C illustrate a wide multiplexer, followed by tree and decode structures for implementing the wide multiplexer.
Figure 2B:
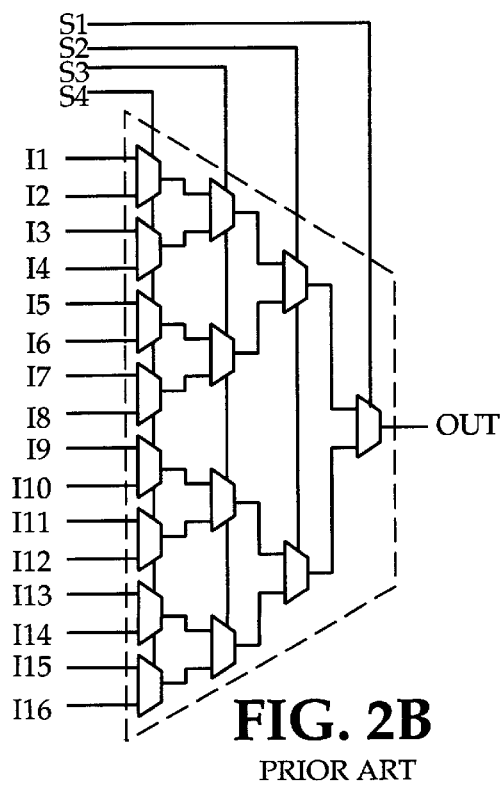
Figure 2C:
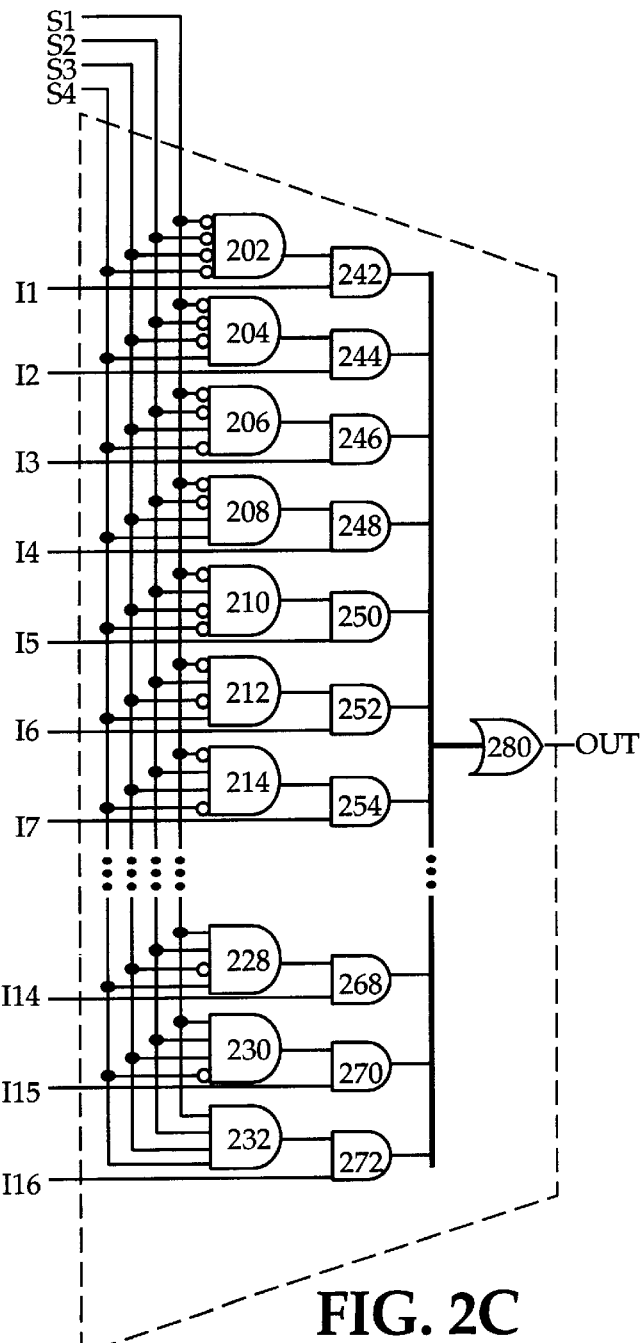

FIG. 2A illustrates a wide multiplexer having 16 input signals and four select signals. FIGS. 2B and 2C illustrate two circuits for implementing this 16-input multiplexer. The circuit of FIG. 2B is a tree structure having four levels of logic. Thus an input signal would pass through four intermediate circuits (2:1 multiplexers) before driving the multiplexer output port OUT and would thus encounter the delay of each intermediate circuit. The circuit of FIG. 2C is a decoding multiplexer in which decoding AND gates 202 through 232 respond to the four select signals S1 through S4 to enable one of AND gates 242 through 272 to pass one of input signals I1 through I16. At most one AND gate 242 through 272 will apply a logic 1 input signal to OR gate 280. OR gate 280 then provides a logic 0 or logic 1 output signal depending upon the signal on the enabled input line. In FIG. 2C, the input signal need pass through only two levels of logic (AND gates 242 through 272 and OR gate 280), but the decoding signals must also pass through four-input AND gates 202 through 232. The implementations of FIGS. 2B and 2C are each preferred in different situations. In the Virtex architecture, the tree structure circuit of FIG. 2B can be implemented in two CLBs (eight LUTs) plus one extra LUT, as discussed below. In the Virtex and XC5200 architectures, the decode multiplexer circuit of FIG. 2C can be implemented using carry multiplexers, as also discussed below.

Returning to FIG. 1, at step 112, a test for whether the FPGA is a Virtex FPGA initiates additional steps in order to take advantage of the F6 multiplexer available in Virtex. At step 114, an indication that the multiplexer has eight or fewer inputs directs the process to step 120, in which the multiplexer is implemented with three or four 4-input LUTs, two F5 multiplexers, and one F6 multiplexer. Details of this implementation are discussed below in the discussion of FIG. 5.

Figure 6:
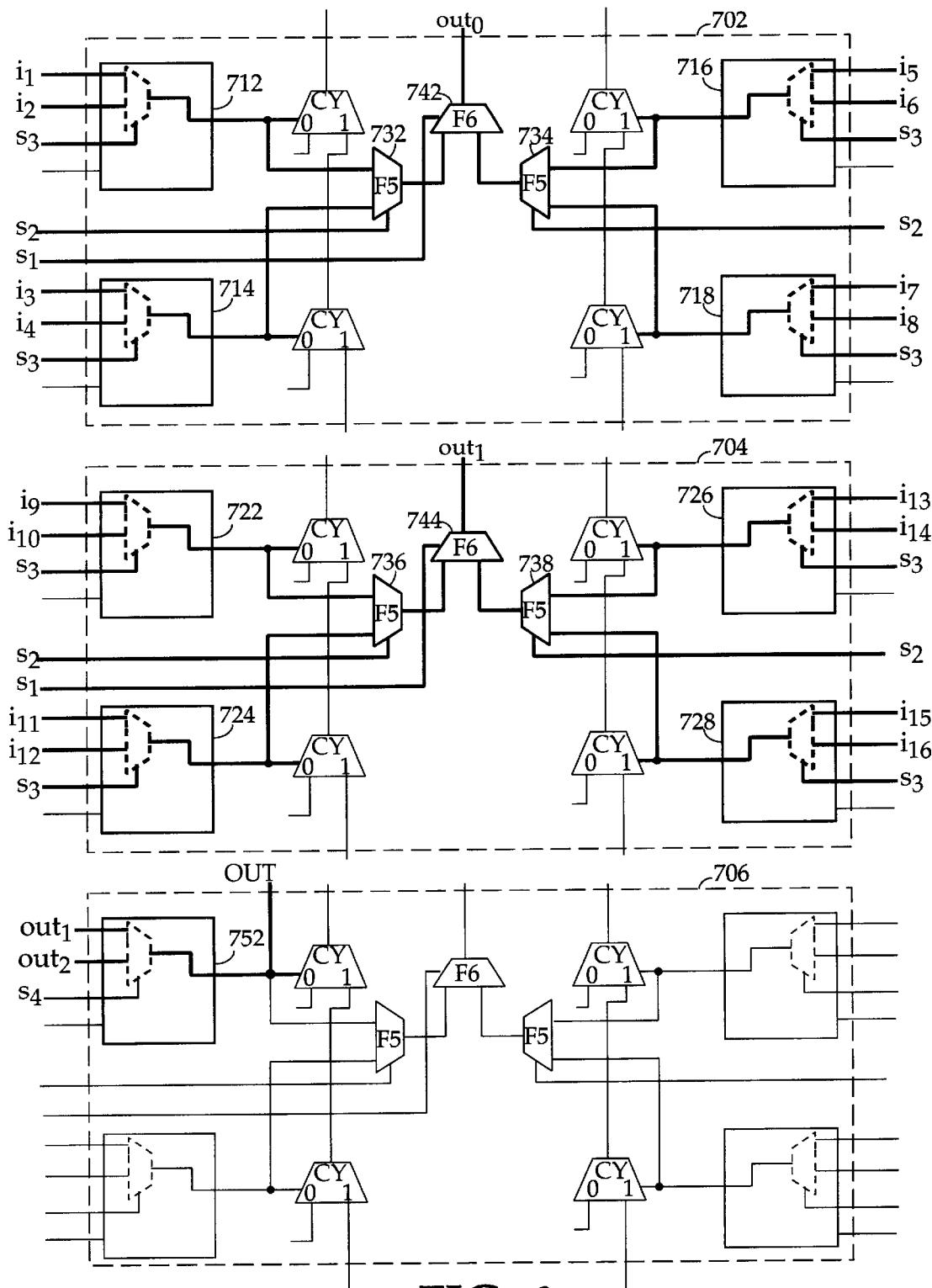
FIG. 6 is a schematic diagram of a 16:1 multiplexer implemented with two 8:1 multiplexers and a third CLB, according to an example embodiment of the invention.

At step 116, a test is made of whether the multiplexer has no more than 16 inputs. If this is the case, control moves to step 122, in which the multiplexer is implemented with five to eight 4-input LUTs (two CLBs), four F5 multiplexers (two from each CLB), two F6 multiplexers (one from each CLB), and the two F6 output signals are routed to a LUT in another CLB to be combined for the final multiplexer output signal as shown in FIG. 6. If step 116 indicates the multiplexer has more than 16 inputs, at step 118, the multiplexer is broken into smaller multiplexers and the process is repeated.

Figure 16:
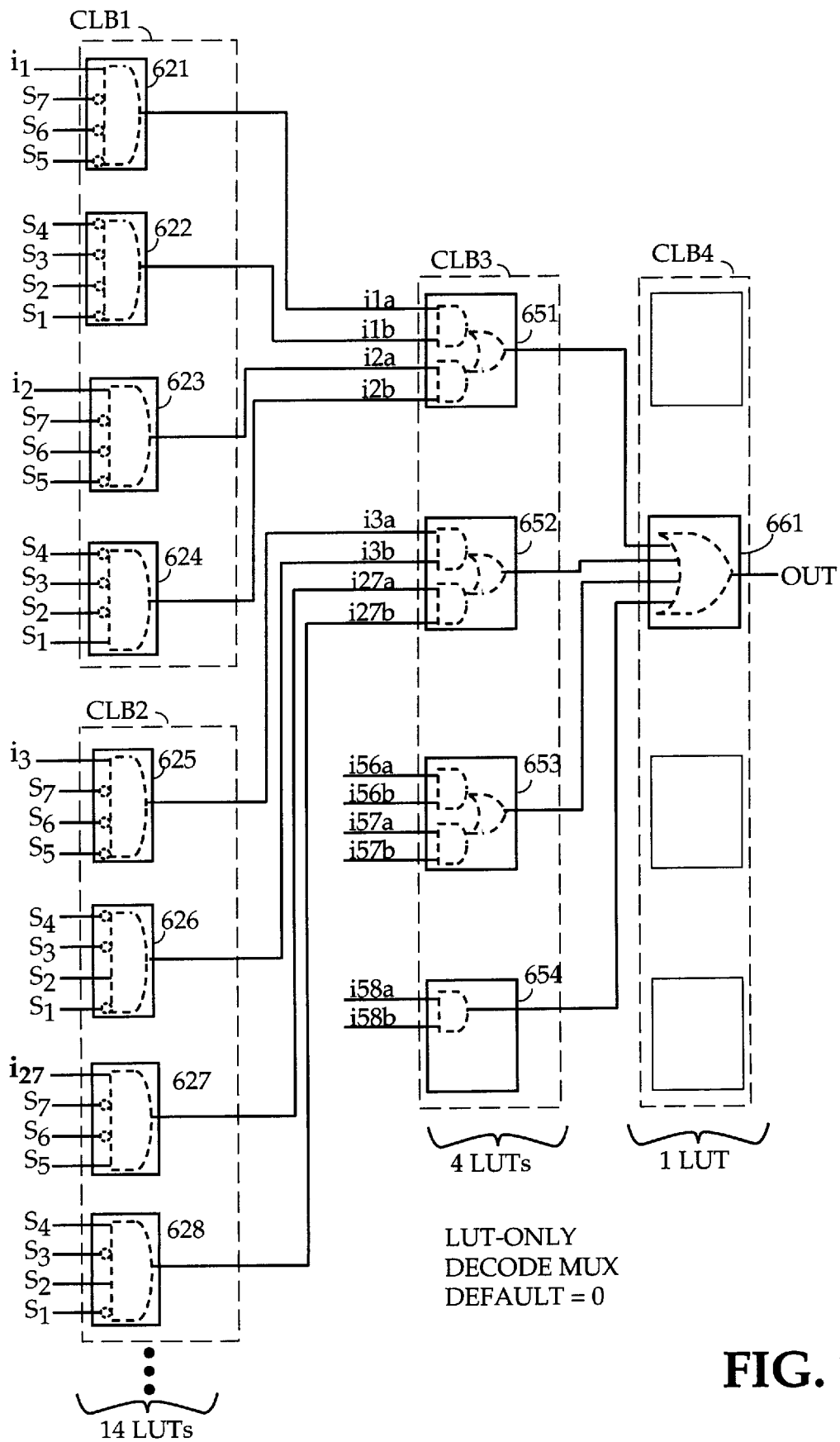
FIG. 16 shows a LUT-only implementation of the structure of FIG. 14.
Figure 17:
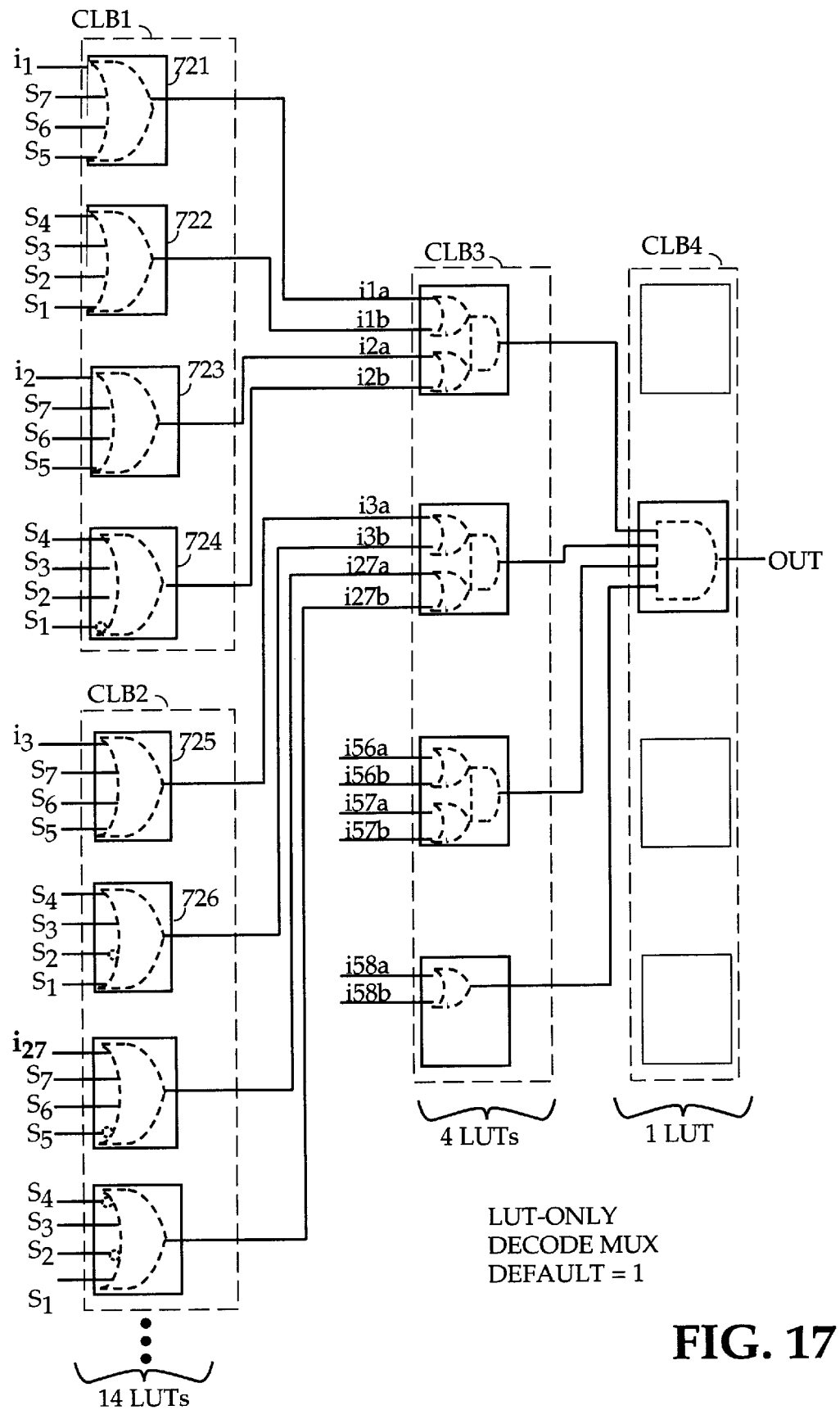
FIG. 17 shows a LUT-only implementation of the structure of FIG. 15.

If the FPGA is not a Virtex, the test at step 112 directs control to step 126 where a decode multiplexer such as shown in FIG. 2C is implemented. There are two ways to implement a decode multiplexer in an FPGA. A decode multiplexer can be implemented entirely in LUTs of the FPGA, or, in accordance with an important aspect of the invention, the decode multiplexer can be implemented in a combination of LUTs and carry/cascade structures of the FPGA. When the default output signal is logic 0, at least one LUT implements the AND function of a decoding combination of inverted or non-inverted select signals and one input signal to be selected when addressed. This structure is discussed below in connection with FIG. 16. Additional LUTs implement additional AND functions if necessary, and finally implements the OR function shown in FIG. 2C. Such a structure makes use of general interconnect routing of the FPGA. Thus the delay of a multiplexer implemented in this manner includes the delay of each LUT through which the signal must pass plus the delay of each routing connection through which the signal must pass. FIGS. 16 and 17 discussed below give examples of this multiplexer implementation when the default value is 0 and 1, respectively.

If the default multiplexer output is logic 0, and any of the multiplexer data input signals are constant 0, these are not implemented. For example, if the design does not use the multiplexer input signal I16, then AND gates 232 and 272 of FIG. 2C do not need to be implemented. If the default multiplexer output is logic 1, and any multiplexer data input signals are constant 1, these constant 1 signals are not implemented. The delay of this implementation is calculated.

According to another aspect of the invention, an alternative configuration for implementing a decode multiplexer can take advantage of the carry/cascade structure in many FPGAs and in some cases achieve higher speed and smaller area. When more than one LUT is required to implement the AND function of one data input signal plus all select signals (with a combination of inverted inputs to address the one data input signal), the AND function can be implemented in adjacent LUTs and the LUT outputs combined through the carry/cascade structures to produce a decoded data input signal. All the decoded data input signals are then combined by implementing NOR functions in a column of adjacent LUTs, applying the decoded data input signals to inputs of these LUTs, and applying the LUT output signals to an associated carry/cascade structure.

At step 128 the alternative decode multiplexer structure (FIG. 2C) is implemented using both LUTs and the carry/cascade structure. The delay is calculated for this implementation as well.

At step 130, the delay of the implementations constructed at steps 124, 126 and 128 is compared. The delay is described in more detail in the discussion that accompanies FIG. 5. The fastest implementation is selected.

It will be appreciated that in the example embodiment, the selected implementation is a netlist that is used to create the programming bitstream for an FPGA.

Figure 3A:
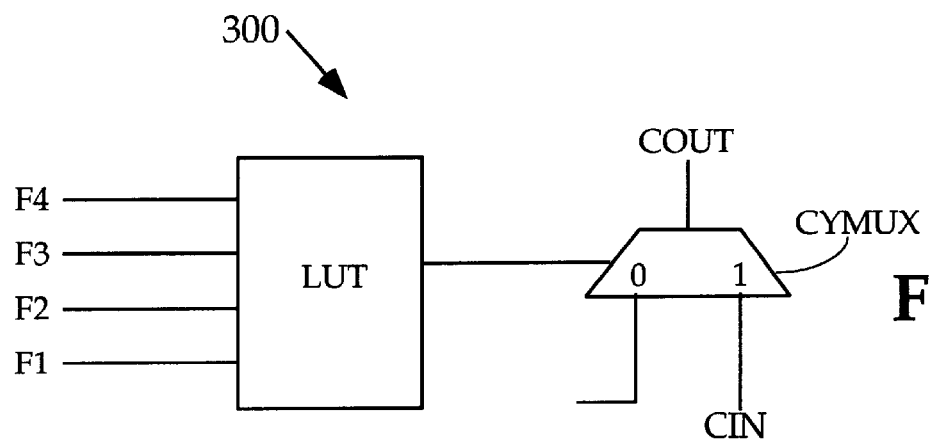
FIGS. 3A, 3B, and 3C show circuit diagrams of portions of fast carry and cascade structures in several FPGA architectures with which the invention may be used.

FIG. 3A is a circuit diagram of a fast carry special feature of a configurable logic block (CLB) available in several Xilinx architectures including the XC5200 FPGA and Virtex. The circuit 300 is simplified in that it only includes those elements needed to understand the present invention. It will be appreciated that these FPGAs have additional circuit elements that are not shown.

The circuit 300 includes a carry multiplexer CYMUX having a "1" input terminal coupled to carry input line CIN and a "0" input terminal coupled to the FPGA interconnect structure. The carry multiplexer CYMUX also has a carry output terminal coupled to carry output line COUT and a carry select terminal coupled to the output terminal of lookup table LUT. Input lines F1, F2, F3, and F4 provide input signals to lookup table LUT. Carry output line COUT is available to be coupled to a carry input line CIN of another instance of circuit 300. Carry input line CIN is available to be coupled to the carry output line COUT of yet another instance of circuit 300 to create a "carry chain" or "cascaded" carry logic. Since the circuit is programmable, the length of the carry chain can be programmably varied, based on the number of such circuits needed to implement a given carry chain.

Figure 3B:
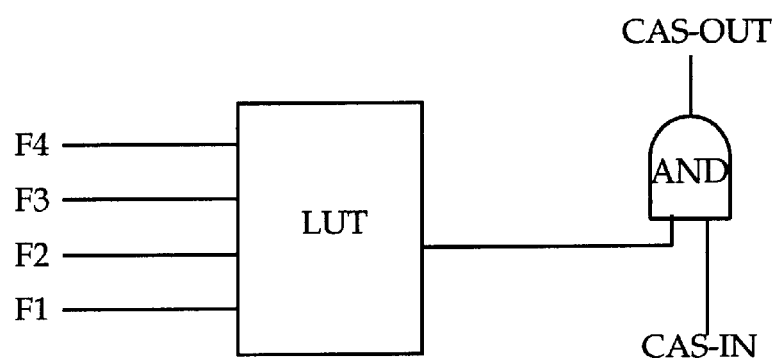

FIG. 3B shows a cascade circuit with which the present invention can also be used. Instead of multiplexer CYMUX, the circuit of FIG. 3B includes an AND gate. The AND gate of FIG. 3B is functionally equivalent to the multiplexer of FIG. 3A when the multiplexer of FIG. 3A receives a constant 0 on its 0-input terminal. The structure of FIG. 3B can also implement other functions than the AND function because it receives input signals from programmable sources. In particular, this structure can implement a wide OR gate. The LUT feeding one AND gate input terminal is of course programmable. The signal feeding the CAS-IN terminal is also programmable since eventually it comes from a LUT below or from a default input signal below. The structure of FIG. 3B is illustrated and discussed by Altera Corp. at pages 42–46 of its Data Book published in March 1995.

Figure 3C:
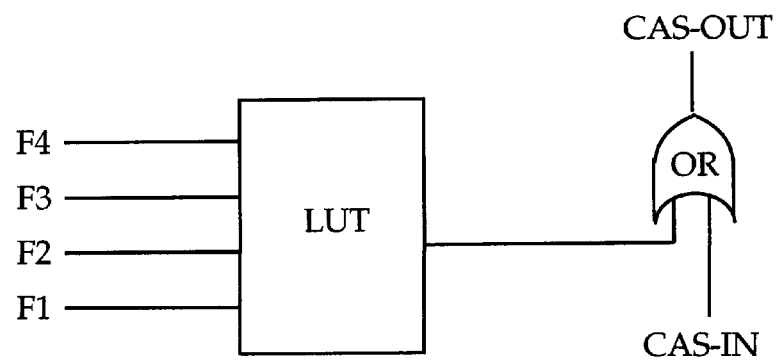

FIG. 3C shows another cascade circuit with which the present invention can be used. Instead of the AND gate of FIG. 3B, the circuit of FIG. 3C includes an OR gate. The OR gate of FIG. 3C is functionally equivalent to the multiplexer of FIG. 3A when the multiplexer of FIG. 3A receives a constant 1 on its 0-input terminal and the associated LUT implements the inverse of the intended function. The structure of FIG. 3C can also implement other functions than the OR function.

Figure 4:
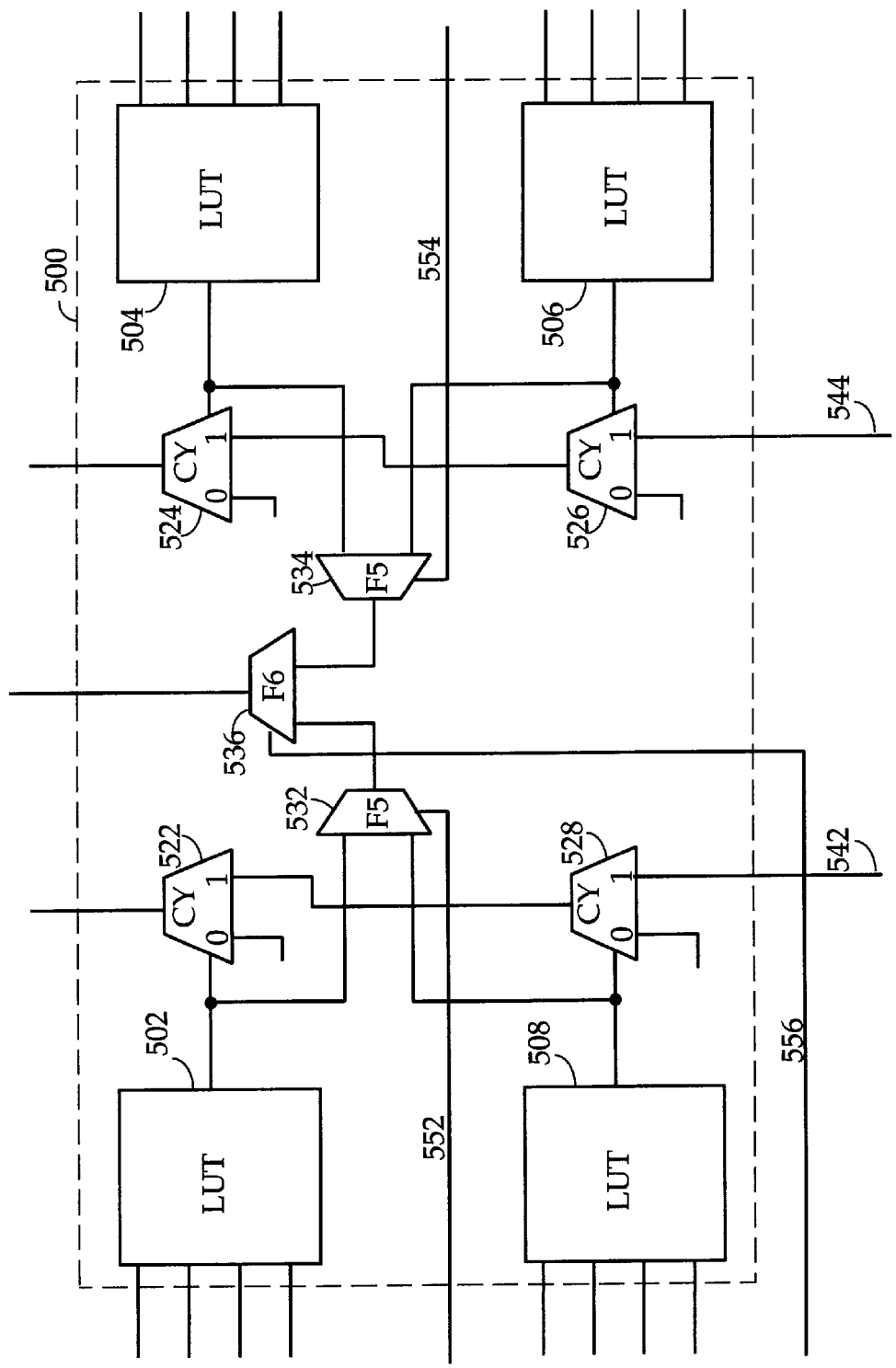
FIG. 4 is a schematic diagram of selected elements of a CLB from a Xilinx Virtex FPGA.

The present invention will work with any of the FPGA architectures of FIGS. 3A through 3C. The structures of FIGS. 3A–3C will be referred to together as carry/cascade structures and an interconnected chain of either multiplexers or AND gates or OR gates will be referred to as a carry/cascade chain. FIG. 4 is a schematic diagram of selected elements of a CLB 500 from a Virtex FPGA. CLB 500 includes 4 LUTs 502, 504, 506, and 508 paired with 4 carry multiplexers 522, 524, 526, and 528. F5 multiplexer 532 receives input signals from LUTs 502 and 508, and F5 multiplexer 534 receives input signals from LUTs 504 and 506. The F6 multiplexer 536 receives input signals from F5 multiplexers 532 and 534.

Figure 5:
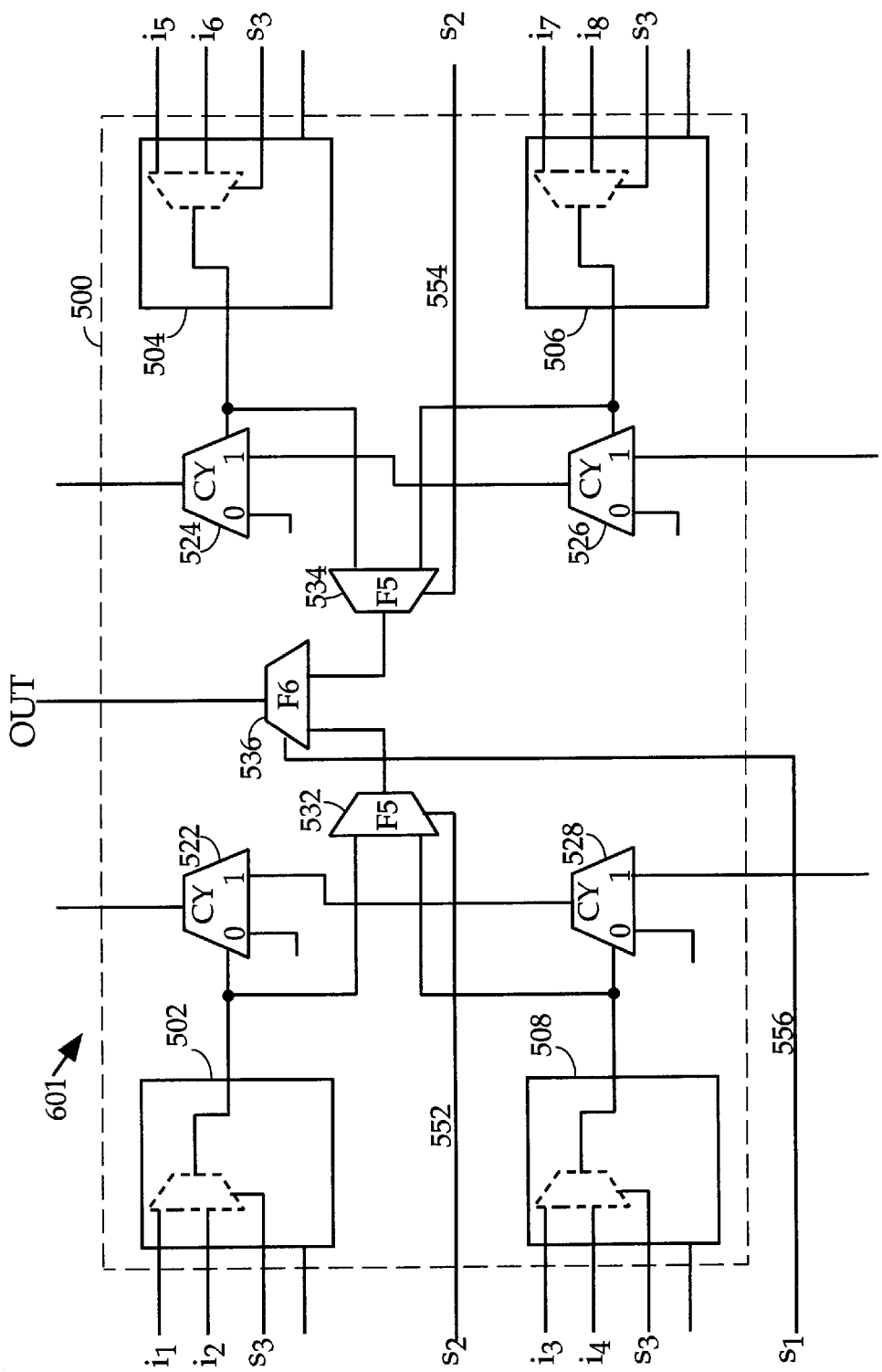
FIG. 5 is a schematic diagram of the Virtex CLB configured to implement an 8:1 multiplexer, according to an example embodiment of the invention.

Carry multiplexers 522–528 of CLB 500 are shown and described even though they are not used in the embodiments illustrated in FIGS. 5 and 6. Each of carry multiplexers 522–528 has a 0-input terminal and a 1-input terminal. The 0-input terminals are coupled to additional circuitry (not shown) within the CLB 500. The 1-input terminals are either coupled to the CY output of another carry multiplexer, for example, carry multiplexer 528 to carry multiplexer 522, or are configurably coupled to a carry multiplexer in another CLB, for example lines 542 and 544 (FIG. 4). Selector inputs of carry multiplexers 522–528 are respectively coupled to outputs of LUTs 502–508.

The F5 and F6 multiplexers 532, 534, and 536 have select inputs that can receive signals provided from outside CLB 500. Line 552 is coupled to the select terminal of F5 multiplexer 532, line 554 is coupled to the select terminal of F5 multiplexer 534, and line 556 is coupled to the select terminal of F6 multiplexer 536. The output of F6 multiplexer 536 is available for use outside CLB 500.

FIG. 5 is a schematic diagram of a Virtex CLB 500 that implements an 8:1 multiplexer 601 according to an example embodiment of the invention. The input signals to multiplexer 601 are designated as $i_1$–$i_8$, and the select signals are designated as $s_1$–$s_3$.

Each of LUTs 502, 504, 506, and 508 implements a 2:1 multiplexer and is configured to receive two respective ones of the input signals and select signal $s_3$. For example, LUT 502 is configured to receive input signals $i_1$ and $i_2$, and LUT 504 is configured to receive input signals $i_3$ and $i_4$. Select signal $s_3$ is input to all of LUTs 502–508. The 2:1 multiplexers implemented by LUTs 502–508 are implemented using the respective input signals $i_1$–$i_8$ as inputs and the selector signal $s_3$ as the select signal. The outputs from the LUT-implemented multiplexers are provided as inputs to F5 multiplexers 532 and 534. Specifically, outputs from LUTs 502 and 504 are input to the F5 multiplexer 532, and the outputs from the LUTs 506 and 508 are input to the F5 multiplexer 534. A second one of the selection signals, i.e., $s_2$, is provided as the selector signal to the F5 multiplexers 532 and 534. Outputs from the F5 multiplexers 532 and 534 are provided as inputs to F6 multiplexer 536, and the third select signal, $s_1$, is provided at the select terminal of F6 multiplexer 536. The output of F6 multiplexer 536 provides the output of the implemented 8:1 multiplexer.

The delay associated with the 8:1 multiplexer 601 is a function of the delays of LUTs 502–508, the F5 multiplexers 532 and 534, and F6 multiplexer 536. For example, the delay of the 8:1 multiplexer can be calculated as: 1-LUT delay+ 1-F5 mux delay+1-F6 delay. In an example embodiment, the LUT delay=LUT delay=0.8, the F5 delay=0.5, and the F6 delay=0.3.

FIG. 6 is a schematic diagram of a 16:1 multiplexer implemented with two 8:1 multiplexers in two CLBs 702 and 704 and a 2:1 multiplexer in a third CLB 706, according to an example embodiment of the invention. Output signals $out_0$ and $out_1$ from CLBs 702 and 704 are routed through the FPGAs general interconnect structure to the third CLB 706. It will be appreciated that the teachings of FIGS. 5 and 6 can be applied to construct larger multiplexers, for example, 32:1, 64:1 multiplexers, etc. using multiple 8:1 multiplexer that are combined with additional CLBs. The input signals to the multiplexer of FIG. 6 are designated as $i_1$–$i_{16}$, and the select signals are designated as $s_1$–$s_4$.

Each of the LUTs 712, 714, 716, 718, 722, 724, 726, and 728 implements a 2:1 multiplexer and is configured to receive two respective ones of the input signals $i_1$–$i_{16}$ and one of the select signals. In this example, LUT 712 is configured to receive input signals $i_1$ and $i_2$, and LUT 714 is configured to receive input signals $i_3$ and $i_4$. LUT 716 receives signals $i_5$ and $i_6$, and LUT 718 receives signals $i_7$ and $i_8$. Input signals $i_9$–$i_{16}$ are similarly allocated to LUTs 722–728. One of the select signals, for example, $s_3$, is input to all the LUTs 712–728. The 2:1 multiplexers implemented by LUTs 712–728 are implemented using the respective input signals $i_1$–$i_{16}$ as inputs and the selector signal $s_3$ as the select signal. The outputs from the LUT-implemented multiplexers are provided as inputs to F5 multiplexers 732, 734, 736, and 738. Specifically, outputs from LUTs 712 and 714 are input to F5 multiplexer 732, and the outputs from LUTs 716 and 718 are input to F5 multiplexer 734. F5 multiplexers 736 and 738 are similarly coupled to LUTs 722–728 of multiplexer 704.

A second one of the selection signals, i.e., $s_2$, is provided as the selector signal to the F5 multiplexers 732–738. Outputs from the F5 multiplexers 732 and 734 are provided as inputs to the F6 multiplexer 742, and the third select signal, $s_1$, is provided at the select terminal of the F6 multiplexer. Similarly in multiplexer 704, outputs from F5 multiplexers 736 and 738 are provided as inputs to F6 multiplexer 744, and the third select signal, $s_1$, is provided at the select terminal of the F6 multiplexer. The outputs of F6 multiplexers 742 and 744 provide the respective outputs of 8:1 multiplexers 702 and 704.

The third CLB 706 is configured to receive as inputs the output signal $out_1$ from multiplexer 702 and the output signal $out_1$ from multiplexer 704. LUT 752 of CLB 706 implements a 2:1 multiplexer that selects between the outputs $out_0$ and $out_1$ of 8:1 multiplexers 702 and 704. The last select signal, i.e., $s_4$, is provided to LUT 752 as the select signal for the implemented 2:1 multiplexer. The output from LUT 752 is connected to the FPGA interconnect structure to provide the output of the 16:1 multiplexer.

The delay for the 16:1 multiplexer is computed in a manner that is similar to that for 8:1 multiplexer 601 of FIG. 5. However, additional delays are introduced by routing to the CLB 706 from the multiplexers 702 and 704 and passing through an additional LUT (752) delay.

Figure 7:
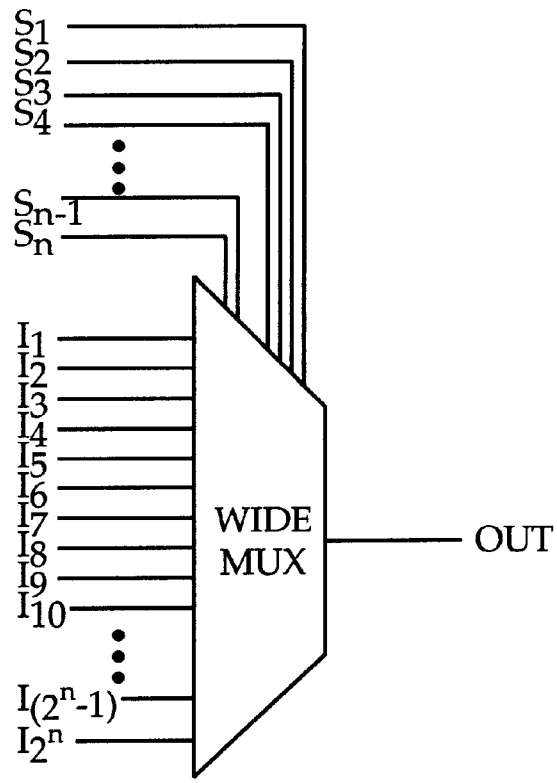
FIGS. 7 and 8 show general and specific wide multiplexers that can be implemented according to the invention.

FIG. 7 shows a wide multiplexer which can be implemented according to the present invention.

Figure 8:
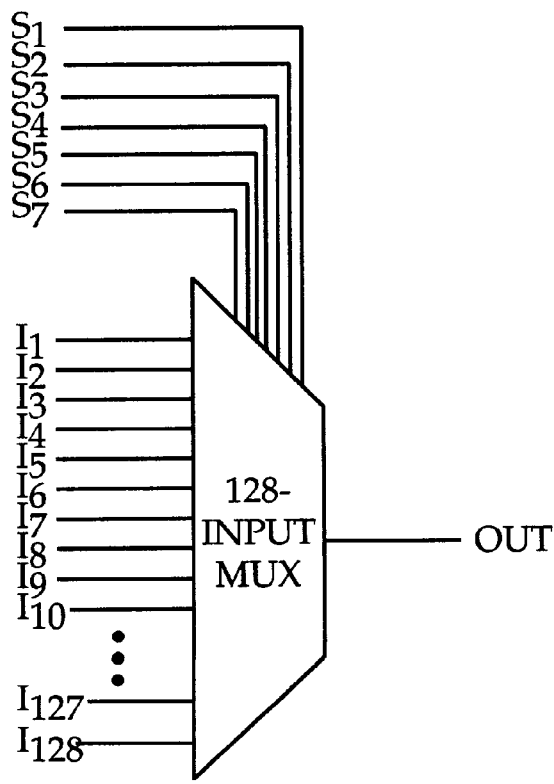

FIG. 8 shows a particular 128-input example of this wide multiplexer for which implementation will be illustrated in detail and discussed in connection with FIGS. 9–12.

Figure 9:
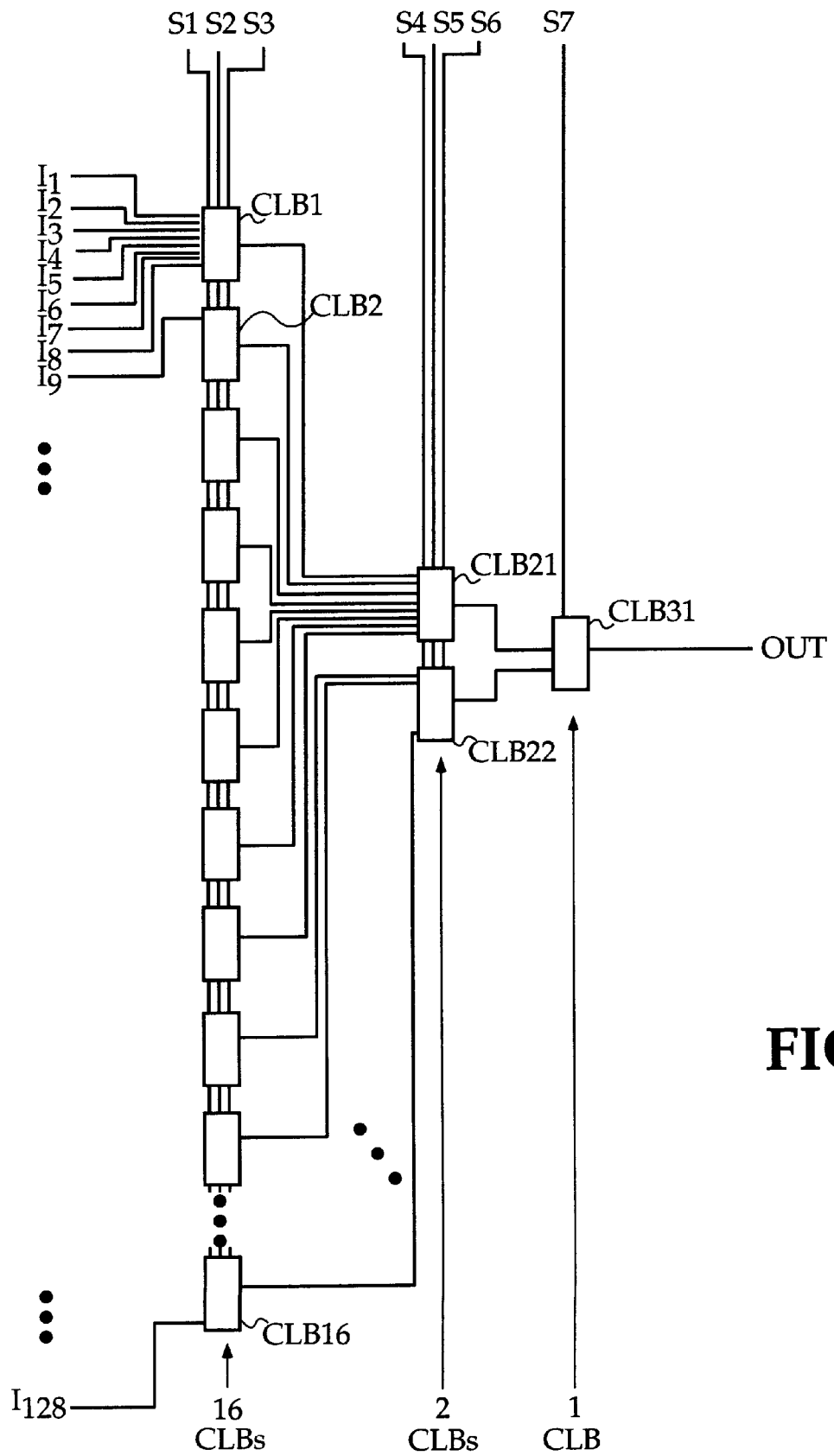
FIG. 9 shows a tree multiplexer implementation of the 128-input multiplexer of FIG. 8.

FIG. 9 shows a tree implementation of this 128-input multiplexer, in which each rectangle represents a CLB of the type shown in FIG. 4. Three stages of CLBs are used to implement the multiplexer. In a first stage, 16 CLBs receive select signals S1 through S3. Each CLB of this first stage receives eight input signals. For example, CLB1 receives input signals $I_1$ through $I_8$. CLB2 receives input signals $I_9$ through $I_{16}$, and so on, CLB16 receiving input signals $I_{121}$ through $I_{128}$. In the second stage, two CLBs, CLB21 and CLB22 receive select signals $S_4$ through $S_6$ and the sixteen output signals from the first stage, and provide input signals to a 2:1 multiplexer of the third stage, which is controlled by select signal $S_7$ and implemented in CLB31.

Figure 10:
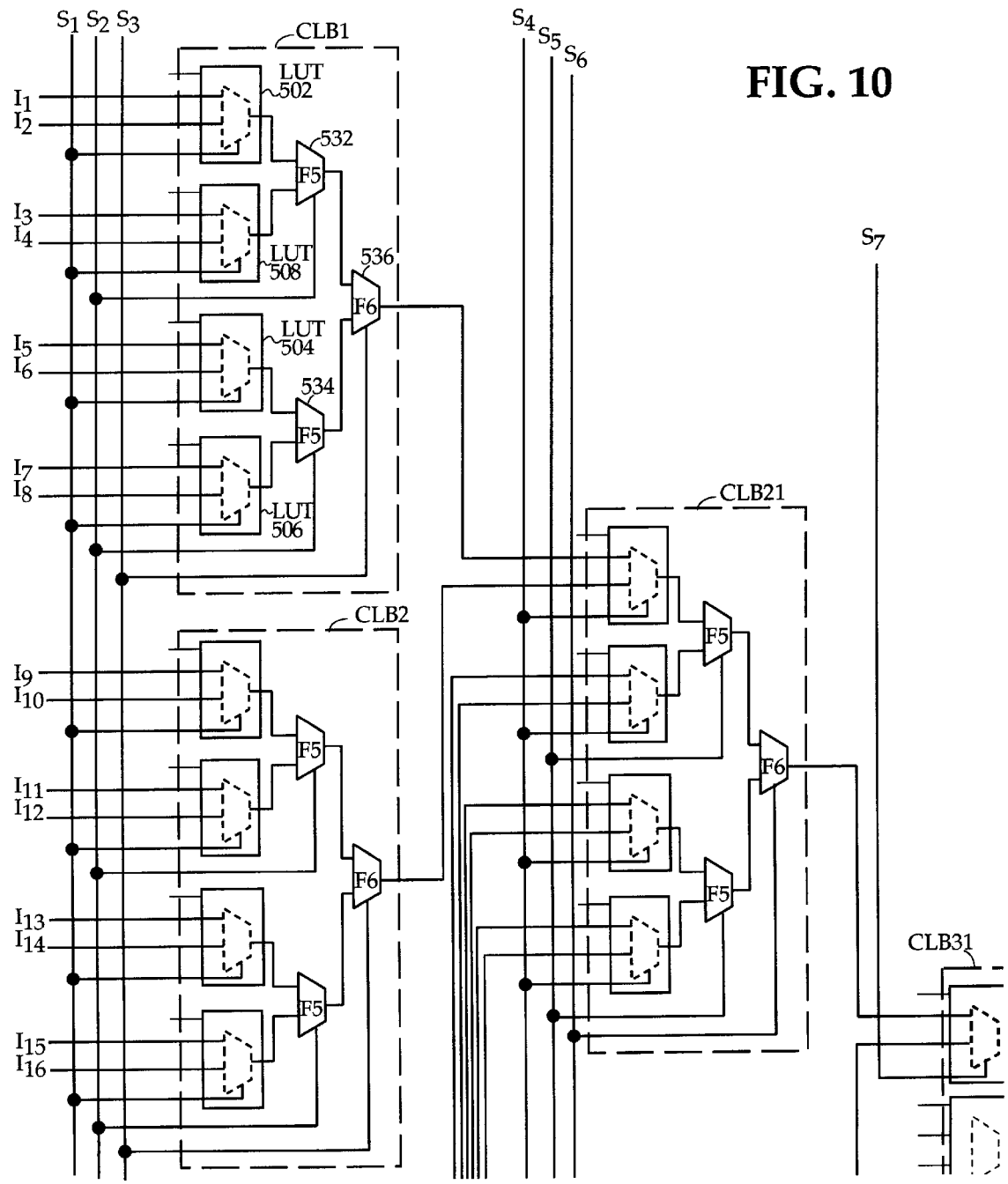
FIG. 10 shows detail of a portion of the tree structure of FIG. 9.

Detail of this implementation is shown in FIG. 10. The four LUTs of CLB1 each implement a 2:1 multiplexer as controlled by select signal $S_1$. The F5 and F6 multiplexers combine the four LUT output signals as controlled by select signals $S_2$ and $S_3$. Numbering of the LUTs and multiplexers of CLB1 corresponds to that in FIG. 4. FIG. 10 also shows CLB2, CLB21, and part of CLB31, and their control by select signals $S_4$ through $S_7$, which is believed to be sufficient to illustrate implementation of the tree structure of FIG. 9.

Figure 11:
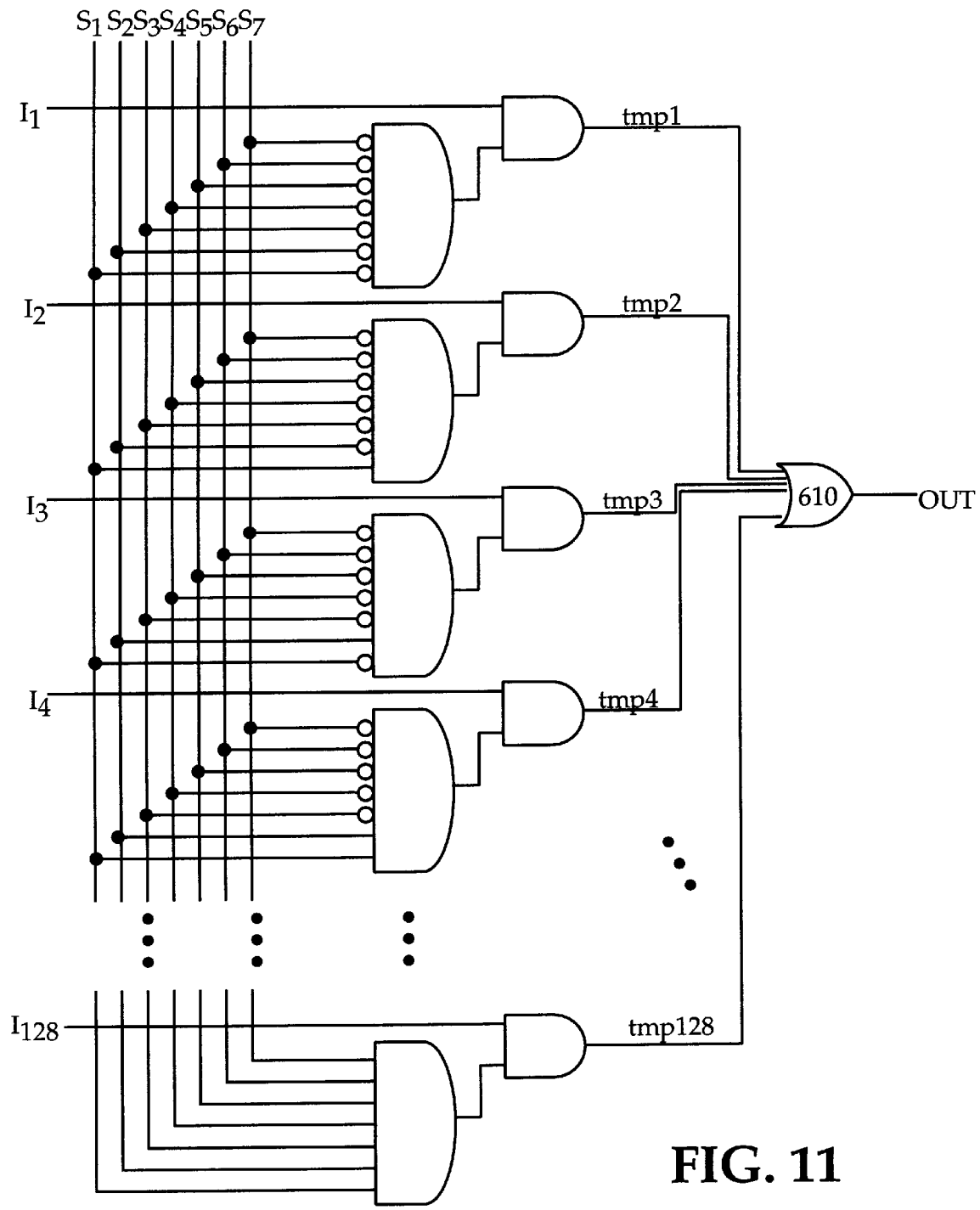
FIG. 11 shows a decode circuit for implementating the 128-input multiplexer of FIG. 8.

The decode implementation of a 128-input multiplexer is shown in FIG. 11, with OR gate 610 passing to the output that temporary signal tmp1 through tmp128 that may carry a logic 1 input signal $I_1$ through $I_{128}$ as selected by select signals $S_1$ through $S_7$.

Figure 12:
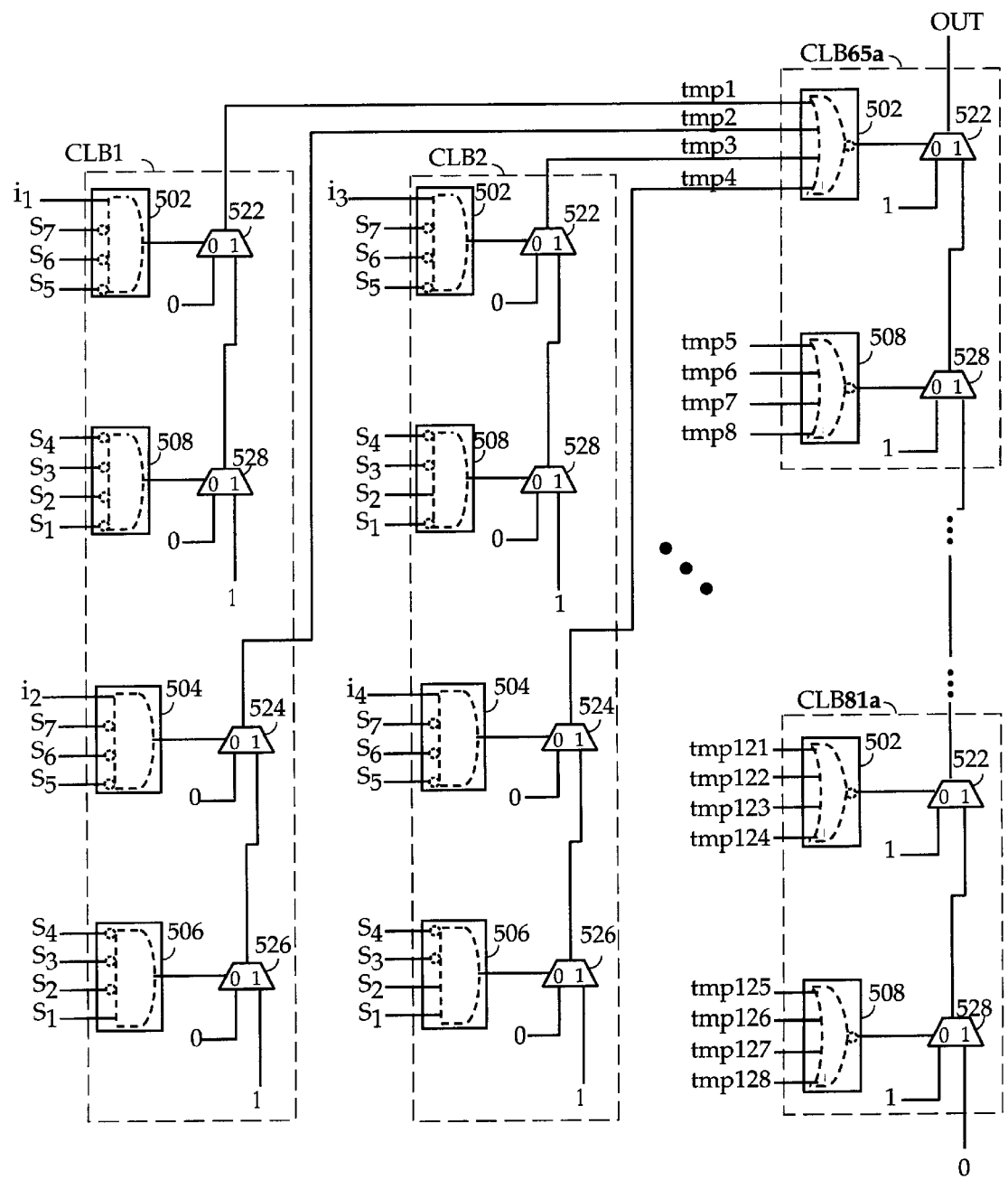
FIG. 12 shows an implementation of the decode structure of FIG. 11.

FIG. 12 illustrates implementation of this structure in the Virtex architecture shown in FIG. 4. In FIG. 12, the numbering of elements within a CLB corresponds to the numbering in FIG. 4. The CLB numbering illustrates one possible placement of portions of the multiplexer in the Virtex architecture, though not the only possible placement. The Virtex architecture includes two carry chains connecting left and right slices of a CLB. The right portion of FIG. 12 illustrates that a long carry chain implements OR gate 610 of FIG. 11, and that this long carry chain is implemented in the left slice running through CLB65a to CLB81a. Many other placements are of course possible and equally feasible.

Timing for generating an output signal of the 128-input multiplexer as implemented in FIG. 12 requires adding the following delays:

> the lowermost LUT,
> getting from the lowermost LUT to the AND stage carry chain,
> two carry stage delays generating tmp128,
> one routing delay,
> the lowermost LUT of the OR stage carry chain,
> getting from that lowermost LUT to the OR stage carry chain, and
> 128/4 stages in the OR stage carry chain.

Depending on the relative delays of the various components in the architecture, this implementation may not be as fast as the tree implementation shown in FIGS. 9 and 10. Delay of the tree implementation of the 128-input multiplexer is the delay for any one of the input signals to pass through > one LUT,
> one F5 multiplexer,
> one F6 multiplexer, -continued

```
        one routing delay,
        one LUT,
        one F5 multiplexer,
        one F6 multiplexer,
        one routing delay, and
        one LUT.
```

If a LUT delay=2.0, getting onto a carry chain=0.9, carry chain delay=0.5 for each stage, F5 delay=0.5, F6 delay=0.3, and routing delay=3.0, then:

The delay for the tree structure of FIG. 9 is $$d_{tree}=2.0+0.5+0.3+3.0+2.0+0.5+0.3+3.0+2.0=13.6$$

The delay for the decode structure of FIG. 12 is $$d_{decode}=2.0+0.9+2*0.5+3.0+2.0+0.9+(128/4)*0.5=25.8$$

Thus in this situation, the tree structure is faster and would be selected, as illustrated in FIG. 1. However, it is common to use far fewer than all input signals to a multiplexer, as discussed above.

Figure 13:
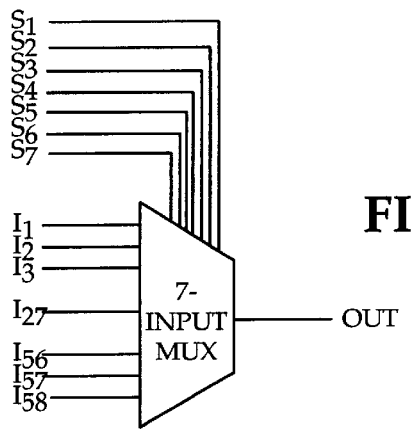
FIG. 13 shows a 7-input, 7-select multiplexer structure.
Figure 14:
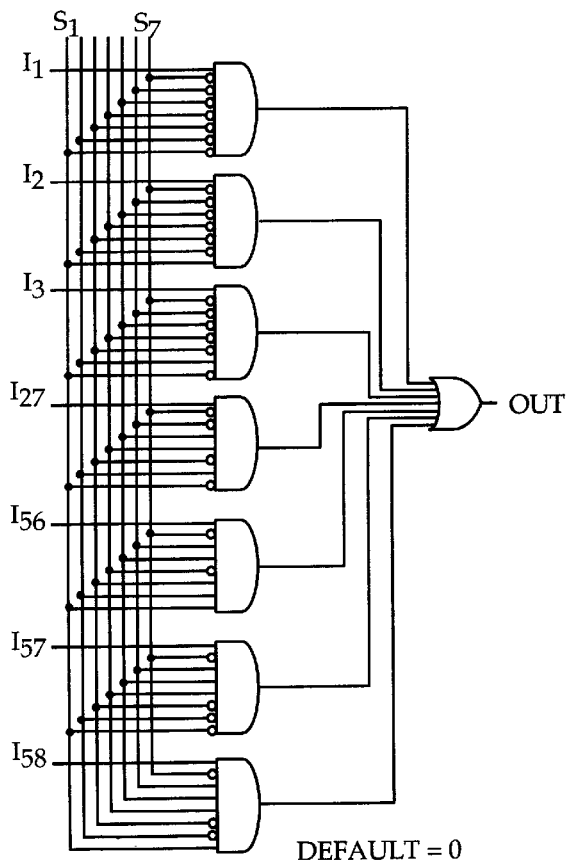
FIGS. 14 and 15 show decode implementations of the circuit of FIG. 13 when the default value is 0 and 1, respectively.

FIG. 13 illustrates an example in which seven select signals S1 through S7 select from seven input signals $I_1$, $I_2$, $I_3$, $I_{27}$, $I_{56}$, $I_{57}$, and $I_{58}$. FIGS. 14–19 illustrate implementations of the circuit of FIG. 13 as a decode multiplexer. The circuit of FIG. 14 results from the following HDL code. Note that the default value is zero if any signal other than the seven input signals is selected.

```
        wire busSigA[0:6];
        select on (busSigA) {
            case '0000000':
                out <= in1;
            case '0000001':
                out <= in2;
            case '0000010':
                out <= in3;
            case '0011010'
                out <= in27;
            case '0110111'
                out <= in56;
            case '0111000'
                out <= in57;
            case '0111001'
                out <= in58;
            case others:
                out <= 1'b0;
            }
```

Figure 15:
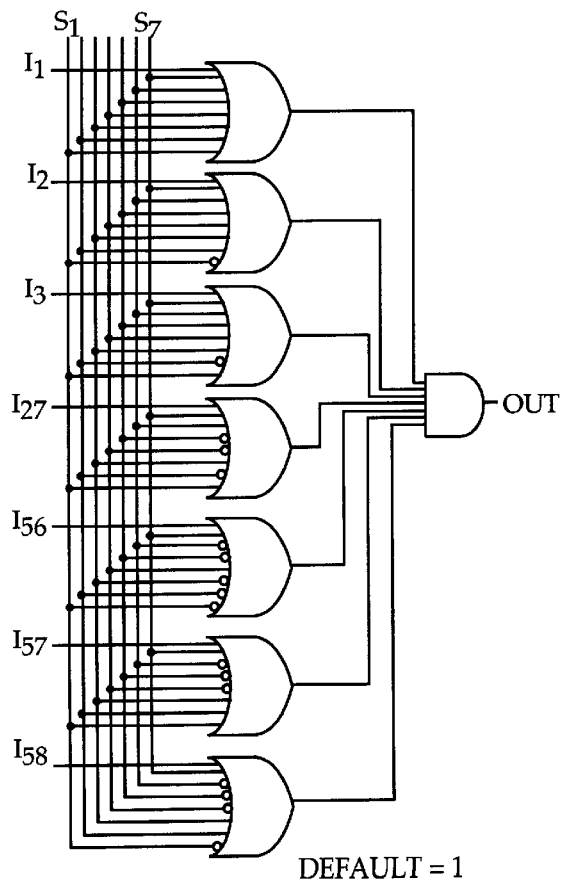

The circuit of FIG. 15 is the desired circuit when the default is logic 1. This circuit results when the last lines of the above code are

```
                case others:
                    out <= 1'b1;
                }
```

As discussed above, a decode multiplexer can be implemented using LUTs alone, or using a combination of LUTs and carry/cascade chain structures.

FIGS. 16 and 17 illustrate implementation using lookup tables alone. The implementation in FIGS. 16 and 17 requires 14 LUTs for a first stage, 4 LUTs for a second stage and one LUT for a final stage for a total of 19 LUTs. The delay experienced by this multiplexer structure is the delay of passing through a LUT, interconnect routing, another LUT, another interconnect routing, and the final LUT. Using the above delay values in which LUT delay=2.0 and routing delay=3, then $$\text{total LUT-only delay}=3*2.0+2*3=12.0$$

for the circuit implementation of FIG. 16. FIG. 17 also uses 19 LUTs and encounters a delay of 12.0.

Figure 18:
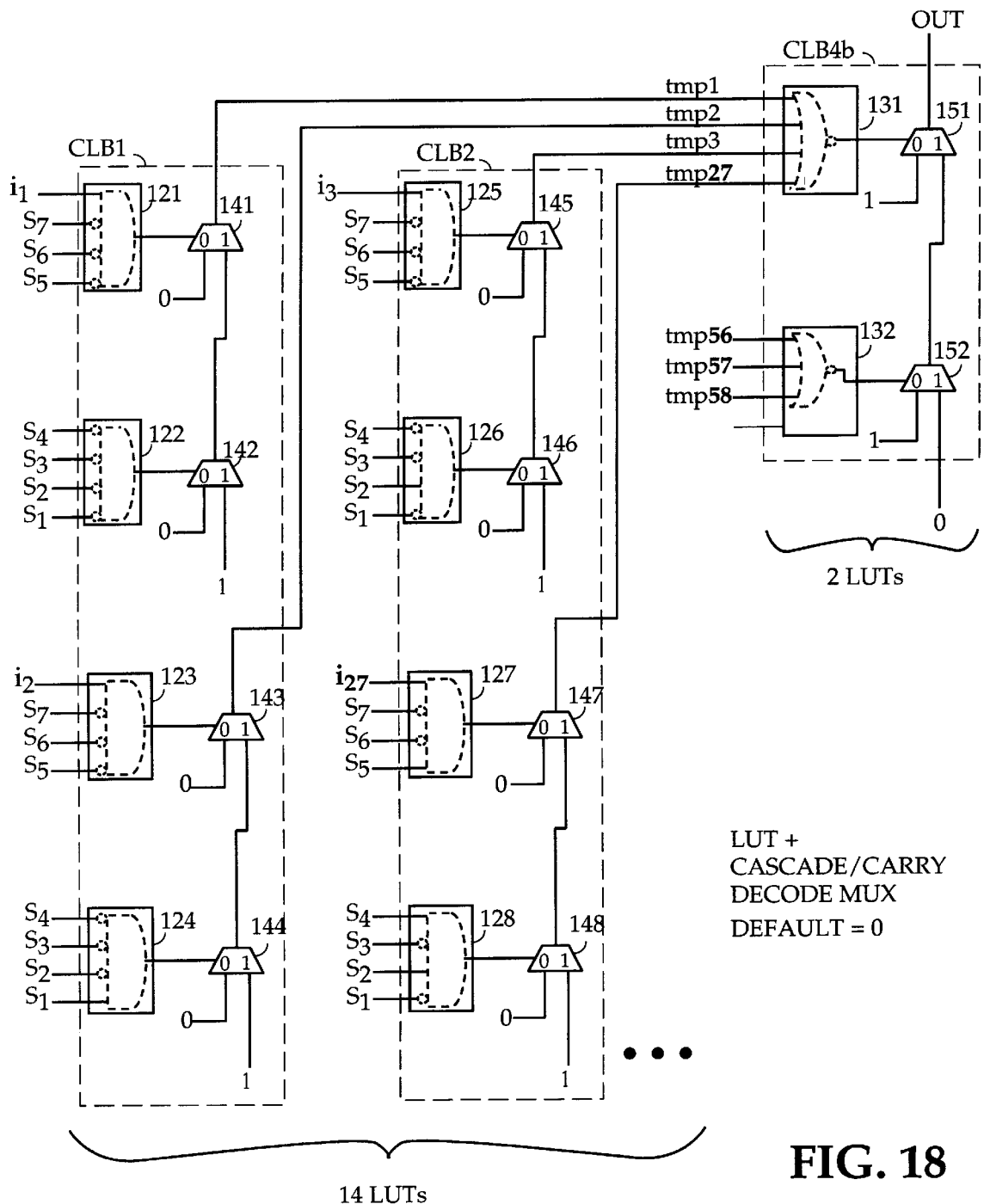
FIG. 18 shows a LUT+carry/cascade implementation of the structure of FIG. 14.
Figure 19:
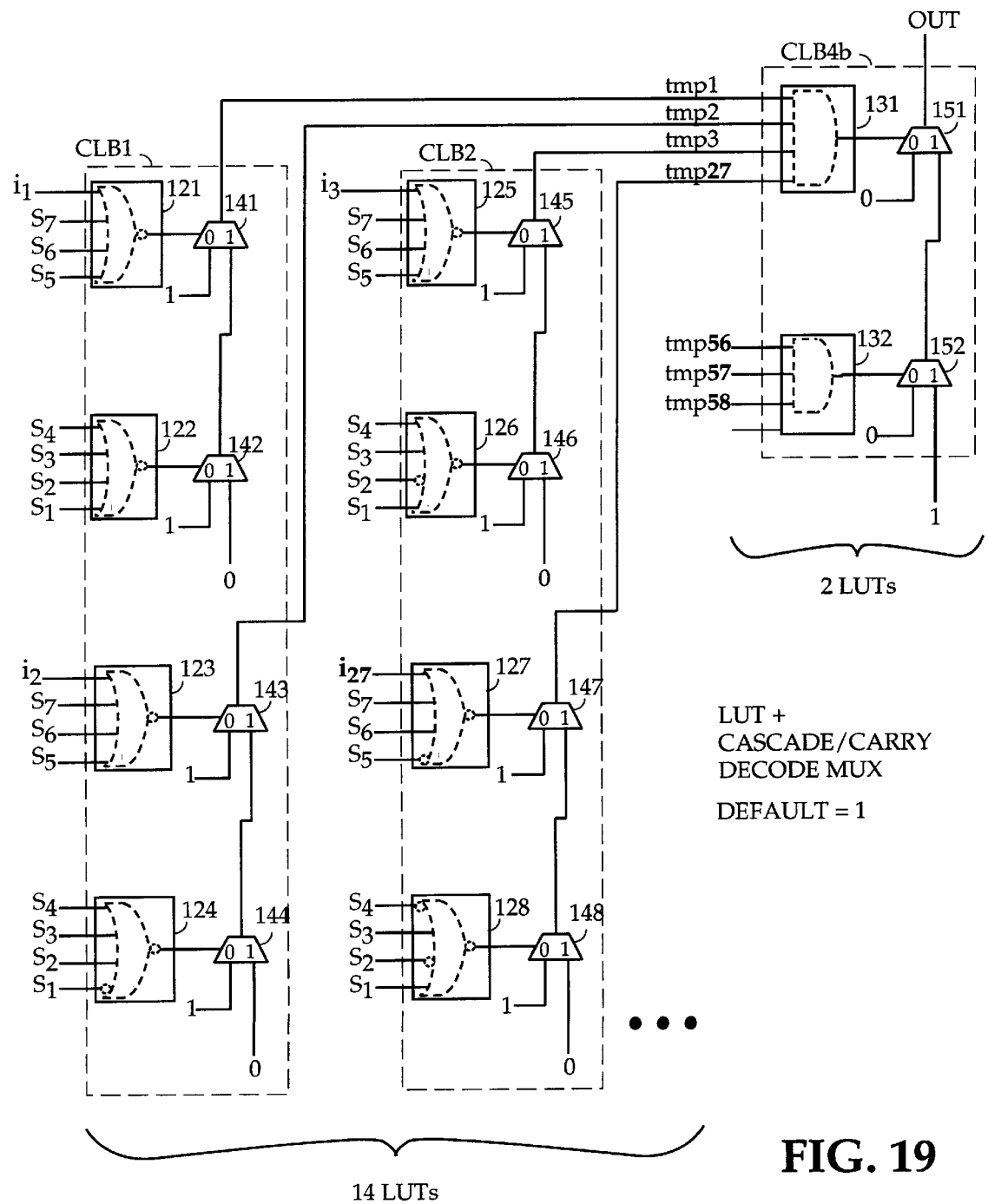
FIG. 19 shows a LUT+carry/cascade implementation of the structure of FIG. 15.

Implementing the multiplexer in a combination of LUTs and carry multiplexers, as shown in FIGS. 18 and 19 uses 14 LUTs for decoding the seven input signals and 2 LUTs for combining 7 decoded signals to produce the multiplexer output signal for a total of 16 LUTs. The slowest signal path experiences one LUT delay, one carry chain delay, one routing delay, another LUT delay and another carry chain delay. Using delay values of the example of FIG. 12, $$\text{total LUT+carry delay}=2.0+0.9+2*0.5+3+2.0+0.9+2*0.5=10.8$$

Thus the implementations shown in FIGS. 18 and 19 are both smaller and faster than the implementations of FIGS. 16 and 17.

Further simplifications can be made when some of the input signals are constant 0 or 1. Consider the case when in1=Logic0, in2=Logic1, and the other input signals in* are variable signals. When the default value is 0, AND gates in LUTs 121 and 122 in FIG. 16 corresponding to in1=Logic0 can be dropped. Shifting the first stage LUTs upward means that the two-input AND gate in LUT 654 can also be dropped. Thus the structure requires only 12+3+1=16 LUTs instead of 19. Likewise, when the default value is 1, the OR gate in LUTs 723 and 724 of FIG. 17 corresponding to in2=Logic1 can be dropped, again reducing the number of LUTs from 19 to 16.

The next case to consider is when the HDL contains several "case" statements in which the output is assigned to Logic0 or Logic1. In this case, an algorithm to decide which cases to drop works as follows:

(1) Combine constant assignments equal to the default value with all signals having the default value to obtain a logic equation for the default condition.

(2) Combine constant assignments not equal to the default value to obtain a logic equation for the non-default condition.

For example, for the HDL code:

```
select on busSigA {
    case '00':
        out <= in1;
    case '01':
        out <= Logic0;
    case '10':
        out <= Logic1;
    case others:
        out <= 1'b0;
}
    the logic equation for the constant i condition is
            (~busSigA[0]) * (busSigA[1]),
    while the logic equation for the constant 0 condition is
            ((busSigA[0]) * (~busSigA[1])) +
                ((busSigA[0]) * (busSigA[1])).
```

Upon simplification, the constant 0 condition becomes busSigA[0]. It is easy to see that the constant 0 condition has the simpler form, so we choose to implement this condition. The constant 1 condition in this case is the new default condition, and all the LUTs corresponding to this condition are dropped.

In the general case, the simpler condition is the one that has the faster implementation (using conventional techniques for logic optimization and implementation, combined with the wide-gate implementation rules illustrated in FIGS. 12, 18, and 19 and further discussed in the related U.S. patent application Ser. No. 09/193,283. Clearly, the simplification resulting from (1) using the carry chain to combine LUT outputs where possible, (2) dropping constant or default signal values, and (3) optimizing logic equations provides clear benefit in terms of both speed and integrated circuit area.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method of implementing a wide multiplexer in an FPGA having a plurality of carry/cascade chains, each chain being driven by a plurality of lookup tables, the method comprising the steps of:

recognizing an instantiation of a multiplexer having input signals and select signals;

for each input signal to the multiplexer, forming from that input signal and all the select signals a decoded input signal on one of the FPGA carry/cascade chains; and applying the decoded input signals to a plurality of LUTs having their outputs applied to adjacent positions on a carry/cascade chain, each LUT programmed to implement a second function, the second function being one of a NOR function and an AND function.

2. In an FPGA having an interconnect structure, lookup tables (LUTs) and a carry/cascade chain fed by associated LUTs, a method of implementing a wide multiplexer having input signals and select signals comprising the steps of:

for each input signal, in one or more adjacent LUTs, forming an AND gate having as inputs the input signal and all the select signals, the AND gate having a different combination of inversions of the select signals from the AND gate of each other input signal, output signals of the one or more adjacent LUTs being combined in the associated carry/cascade chain to produce a decoded input signal; and applying the decoded input signals to input terminals of one or more adjacent LUTs connected to a final carry/cascade chain, wherein each of these adjacent LUTs connected to the final carry/cascade chain is configured as a NOR gate, whereby the final carry/cascade chain provides the multiplexer output signal.

3. The method of claim 2 wherein the output signals of the one or more adjacent LUTs are combined in the associated carry/cascade chain by a carry multiplexer in the carry/cascade chain having an output terminal, having a select terminal fed by the associated LUT output signal, having one carry multiplexer input terminal connected to another carry multiplexer output terminal, and having another carry multiplexer input terminal receiving a constant logic 0 signal, a first carry multiplexer in the carry/cascade chain receiving a constant logic 1 signal.

4. The method of claim 2 wherein the output signals of the one or more adjacent LUTs are combined in the associated carry/cascade chain by an AND gate in the carry/cascade chain having an AND gate output terminal, having a first input terminal fed by the associated LUT output signal, and a second input terminal connected to another AND gate output terminal, a first AND gate in the carry/cascade chain receiving a constant logic 1 signal.

5. The method of claim 2 wherein the output signals of the one or more adjacent LUTs are combined in the associated carry/cascade chain by an OR gate in the carry/cascade chain having an OR gate output terminal, having a first input terminal fed by the associated LUT output signal, and a second input terminal connected to another OR gate output terminal, a first OR gate in the carry/cascade chain receiving a constant logic 0 signal.

6. The method of claim 2 wherein the output signals of the one or more adjacent LUTs connected to a final carry/cascade chain are combined in the associated final carry/cascade chain by a carry multiplexer in the final carry/cascade chain having an output terminal, having a select terminal fed by the associated LUT output signal, having one carry multiplexer input terminal connected to another carry multiplexer output terminal, and having another carry multiplexer input terminal receiving a constant logic 1 signal, a first carry multiplexer in the carry/cascade chain receiving a constant logic 0 signal.

7. The method of claim 2 wherein the output signals of the one or more adjacent LUTs connected to a final carry/cascade chain are combined in the associated final carry/cascade chain by an AND gate in the final carry/cascade chain having an AND gate output terminal, having a first input terminal connected to receive the output signal of the associated LUT and having a second input terminal connected to the output terminal of an adjacent AND gate in the final carry/cascade chain, a first AND gate in the final carry/cascade chain receiving a constant logic 1 signal.

8. The method of claim 2 wherein the output signals of the one or more adjacent LUTs connected to a final carry/cascade chain are combined in the associated final carry/cascade chain by an OR gate in the final carry/cascade chain having an OR gate output terminal, having a first input terminal connected to receive the output signal of the associated LUT and having a second input terminal connected to the output terminal of an adjacent OR gate in the final carry/cascade chain, a first OR gate in the final carry/cascade chain receiving a constant logic 0 signal.

9. In an FPGA having an interconnect structure, lookup tables (LUTs) and a carry/cascade chain fed by adjacent ones of the LUTs, a method of implementing a wide multiplexer having input signals and select signals as a decoded multiplexer, the method comprising the steps of:

for each input signal, in one or more adjacent LUTs, forming an OR gate having as inputs the input signal and all the select signals, the OR gate having a different combination of inversions of the select signals from the OR gate of each other input signal, output signals of the one or more adjacent LUTs being combined in the associated carry/cascade chain to produce a decoded input signal; and applying the decoded input signals to input terminals of one or more adjacent LUTs connected to a final carry/cascade chain, wherein each of these adjacent LUTs connected to the final carry/cascade chain is configured as an AND gate, whereby the final carry/cascade chain provides the multiplexer output signal.

10. The method of claim 9 wherein the output signals of the one or more adjacent LUTs are combined in the associated carry/cascade chain by a carry multiplexer in the carry/cascade chain having an output terminal, having a select terminal fed by the associated LUT output signal, having one carry multiplexer input terminal connected to another carry multiplexer output terminal, and having another carry multiplexer input terminal receiving a constant logic 1 signal, a first carry multiplexer in the carry/cascade chain receiving a constant logic 0 signal.

11. The method of claim 9 wherein the output signals of the one or more adjacent LUTs are combined in the associated carry/cascade chain by an AND gate in the carry/cascade chain having an AND gate output terminal, having a first input terminal connected to receive the output signal of the associated LUT and having a second input terminal connected to the output terminal of an adjacent AND gate in the carry/cascade chain, a first AND gate in the carry/cascade chain receiving a constant logic 1 signal.

12. The method of claim 9 wherein the output signals of the one or more adjacent LUTs are combined in the associated carry/cascade chain by an OR gate in the carry/cascade chain having an OR gate output terminal, having a first input terminal connected to receive the output signal of the associated LUT and having a second input terminal connected to the output terminal of an adjacent OR gate in the carry/cascade chain, a first OR gate in the carry/cascade chain receiving a constant logic 0 signal.

13. The method of claim 9 wherein the output signals of the one or more adjacent LUTs connected to a final carry/cascade chain are combined in the associated final carry/cascade chain by a carry multiplexer in the final carry/cascade chain having an output terminal, having a select terminal fed by the associated LUT output signal, having one carry multiplexer input terminal connected to another carry multiplexer output terminal, and having another carry multiplexer input terminal receiving a constant logic 0 signal, a first carry multiplexer in the final carry/cascade chain receiving a constant logic 1 signal.

14. The method of claim 9 wherein the output signals of the one or more adjacent LUTs connected to a final carry/cascade chain are combined in the associated final carry/cascade chain by an AND gate in the final carry/cascade chain having an AND gate output terminal, having a first input terminal fed by the associated LUT output signal, and a second input terminal connected to another AND gate output terminal, a first AND gate in the final carry/cascade chain receiving a constant logic 1 signal.

15. The method of claim 9 wherein the output signals of the one or more adjacent LUTs connected to a final carry/cascade chain are combined in the associated final carry/cascade chain by an OR gate in the final carry/cascade chain having an OR gate output terminal, having a first input terminal fed by the associated LUT output signal, and a second input terminal connected to another OR gate output terminal, a first OR gate in the final carry/cascade chain receiving a constant logic 0 signal.

* * * * *